US012256632B2

(12) United States Patent
He et al.

(10) Patent No.: US 12,256,632 B2
(45) Date of Patent: Mar. 18, 2025

(54) ORGANIC OPTOELECTRONIC DEVICES BASED ON A SINGLE-CRYSTAL PT COMPLEX

(71) Applicant: KING ABDULLAH UNIVERSITY OF SCIENCE AND TECHNOLOGY, Thuwal (SA)

(72) Inventors: Jr-Hau He, Thuwal (SA); Dharmaraj Periyanagounder, Thuwal (SA); Tzu-Chiao Wei, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 540 days.

(21) Appl. No.: 17/765,131

(22) PCT Filed: Oct. 1, 2020

(86) PCT No.: PCT/IB2020/059219
§ 371 (c)(1),
(2) Date: Mar. 30, 2022

(87) PCT Pub. No.: WO2021/064637
PCT Pub. Date: Apr. 8, 2021

(65) Prior Publication Data
US 2022/0359837 A1  Nov. 10, 2022

Related U.S. Application Data

(60) Provisional application No. 62/908,683, filed on Oct. 1, 2019.

(51) Int. Cl.
H10K 85/30 (2023.01)
H10K 30/65 (2023.01)
H10K 30/88 (2023.01)

(52) U.S. Cl.
CPC .......... *H10K 85/346* (2023.02); *H10K 30/65* (2023.02); *H10K 30/88* (2023.02)

(58) Field of Classification Search
CPC ...................... H10K 30/65; H10K 85/30–381
See application file for complete search history.

(56) References Cited

U.S. PATENT DOCUMENTS

2005/0211974 A1* 9/2005 Thompson .......... C07F 15/0033
257/40

OTHER PUBLICATIONS

Bao, Z., "Materials and Fabrication Needs for Low-Cost Organic Transistor Circuits," Advanced Materials, 2000, vol. 12, No. 3, pp. 227-230, Wiley-VCH Verlag GmbH.
(Continued)

Primary Examiner — Daniel P Shook
(74) Attorney, Agent, or Firm — PATENT PORTFOLIO BUILDERS PLLC

(57) ABSTRACT

A photodetection device is configured to detect light and the photodetection device includes a substrate having a largest surface; a dielectric formed over the largest surface of the substrate; a first metallic electrode formed on the dielectric; a second metallic electrode formed on the dielectric, at a given distance from the first metallic electrode, to form a channel; and a single-crystal linear-chain polyfluorinated dibromo-platinum(II) diimine complex located in the channel.

20 Claims, 13 Drawing Sheets

(56) References Cited

OTHER PUBLICATIONS

Biffinger, J.C., et al., "The Polar Hydrophobicity of Fluorinated Compounds," ChemBioChem, May 2004, vol. 5, pp. 622-627, Wiley-VCH Verlag Gmbh & Co. KGaA, Weinheim.
Briseno, A.L., et al., "Patterning Organic Single-Crystal Transistor Arrays," Letters, Dec. 14, 2006, vol. 444, pp. 913-917, Nature Publishing Group.
Dunitz, J.D., et al., "Organic Fluorine Hardly Ever Accepts Hydrogen Bonds," Chemistry a European Journal, Jan. 1997, vol. 3, No. 1, pp. 89-98.
International Search Report in corresponding/related International Application No. PCT/IB2020/059219, date of mailing Jan. 19, 2021.
Klauk, H., et al., "Ultralow-Power Organic Complementary Circuits," Nature, Feb. 15, 2007, vol. 445, pp. 745-748, Nature Publishing Group.
Ling, M.-M., et al., "Air-Stable n-Channel Copper Hexachlorophthalocyanine for Field-Effect Transistors," Applied Physics Letters, Oct. 20, 2006, vol. 89, pp. 163516-1-163516-3, American Institute of Physics.
Lu, N., et al., "Structure and Emission Studies of Dimorphic Crystals of [PtBr2(5,5'-bis(CF3CH2OCH2)-2,2'-bpy)] (1)†," Dalton Transactions, Nov. 11, 2013, 8 pages, Royal Society of Chemistry.
Lu, N., et al., "Synthesis and Characterization of Polyfluorinated 2,20-bipyridines and their Palladium and Platinum Complexes, [MX2(bis(RfCH2OCH2)-2,20-bpy)] (X = Cl, Br)," Journal of Fluorine Chemistry, Feb. 25, 2012, vol. 137, pp. 54-63, Elsevier B.V.
Sundar, V.C., et al., "Elastomeric Transistor Stamps: Reversible Probing of Charge Transport in Organic Crystals," Research Articles, Mar. 12, 2004, vol. 303, pp. 1644-1646.
Uttiya, S., et al., "Stability to Photo-Oxidation of Rubrene and Fluorine-Substituted Rubrene," Synthetic Metals, Sep. 7, 2011, vol. 161, pp. 2603-2606, Elsevier B.V.
Wang, C., et al., "Semiconducting π-Conjugated Systems in Field-Effect Transistors: A Material Odyssey of Organic Electronics," Chemical Reviews, Nov. 23, 2011, pp. 2208-2267, ACS Publications.
Weitz, R.T., et al., "Organic n-Channel Transistors Based on Core-Cyanated Perylene Carboxylic Diimide Derivatives," Journal of American Chemical Society, Mar. 13, 2008, vol. 130, pp. 4637-4645.
Written Opinion of the International Searching Authority in corresponding/related International Application No. PCT/IB2020/059219, date of mailing Jan. 19, 2021.
Zeis, R., et al., "Single-Crystal Field-Effect Transistors Based on Copper Phthalocyanine," Applied Physics Letters, Jan. 3, 2005, vol. 86, pp. 022103-1-022103-3, American Institute of Physics.

\* cited by examiner

ORGANIC OPTOELECTRONIC DEVICES BASED ON A SINGLE-CRYSTAL PT COMPLEX

CROSS-REFERENCE TO RELATED APPLICATIONS

This application is a U.S. National Stage Application of International Application No. PCT/IB2020/059219, filed on Oct. 1, 2020, which claims priority to U.S. Provisional Patent Application No. 62/908,683, filed on Oct. 1, 2019, entitled "HIGHLY AIR-STABLE, WATER-RESISTANT AND FAST RESPONSE ORGANIC PHOTODETECTORS BASED ON A SINGLE CRYSTAL PT COMPLEX," the disclosures of which are incorporated herein by reference in their entirety.

BACKGROUND

Technical Field

Embodiments of the subject matter disclosed herein generally relate to a photodetector that has a fast-response, is highly stable in air, and is water resistant, and more particularly, to a photodetector that has the active layer made of an organic single crystal having a lamellar molecular structure.

Discussion of the Background

Photodetectors (PDs) are sensors that detect electromagnetic radiation (e.g., light) and are at the core of many technologies, for example, chemical and biological analyses, combustion flame monitoring, image sensors, remote controls, optical communications, night vision, and machine version. PDs displaying high responsivity and speed are typically made using inorganic semiconductors, leveraging the high mobility and stability of these materials. However, conventional inorganic PDs have a low strain tolerance and are limited to rigid substrates and gradual electrical changes, in which large mechanical strain can lead to the deterioration of the spectral response or result in device failure.

The next generation consumer electronics require devices that are more flexible and portable. Thus, such electronic devices need to use organic semiconductors, which feature molecularly tunable properties, excellent semiconductivity, and facile and low-temperature processing. The organic semiconductors have emerged as a new class of revolutionary materials that represent an alternative to commercial inorganic-based PDs. Moreover, organic semiconductors offer several benefits: they are lightweight, thin, flexible, semitransparent, and offer simple device integration and compatibility with plastic substrates and biological systems. Also advantageous is that the organic semiconductors are more eco-friendly compared to the inorganic semiconductors.

Despite being an outstanding material for various applications, the stability and electrical properties of the organic semiconductors currently used in the various PD are not yet suitable. Generally, the organic semiconductors that have been tried for various PDs are limited by the low carrier mobility and high threshold voltage due to the carrier scattering caused by impurities, structural defects, and grain boundaries, which hinder the development and integration of these materials for high-performance and low-cost applications.

Thus, there is a need for a new PD that is based on an organic semi-conductor and overcomes the above noted problems.

BRIEF SUMMARY OF THE INVENTION

According to an embodiment, there is a photodetection device that includes a substrate having a largest surface, a dielectric formed over the largest surface of the substrate, a first metallic electrode formed on the dielectric, a second metallic electrode formed on the dielectric, at a given distance from the first metallic electrode, to form a channel, and a single-crystal linear-chain polyfluorinated dibromo-platinum(II) diimine complex located in the channel.

According to another embodiment, there is a phototransistor that includes a substrate having a largest surface, a dielectric layer formed over the largest surface of the substrate, a first metallic electrode formed on the dielectric, a second metallic electrode formed on the dielectric, at a given distance from the first metallic electrode, to form a channel, a single-crystal linear-chain polyfluorinated dibromo-platinum(II) diimine complex located in the channel, and a gate electrode formed to face the single-crystal linear-chain polyfluorinated dibromo-platinum(II) diimine complex through a dielectric material.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
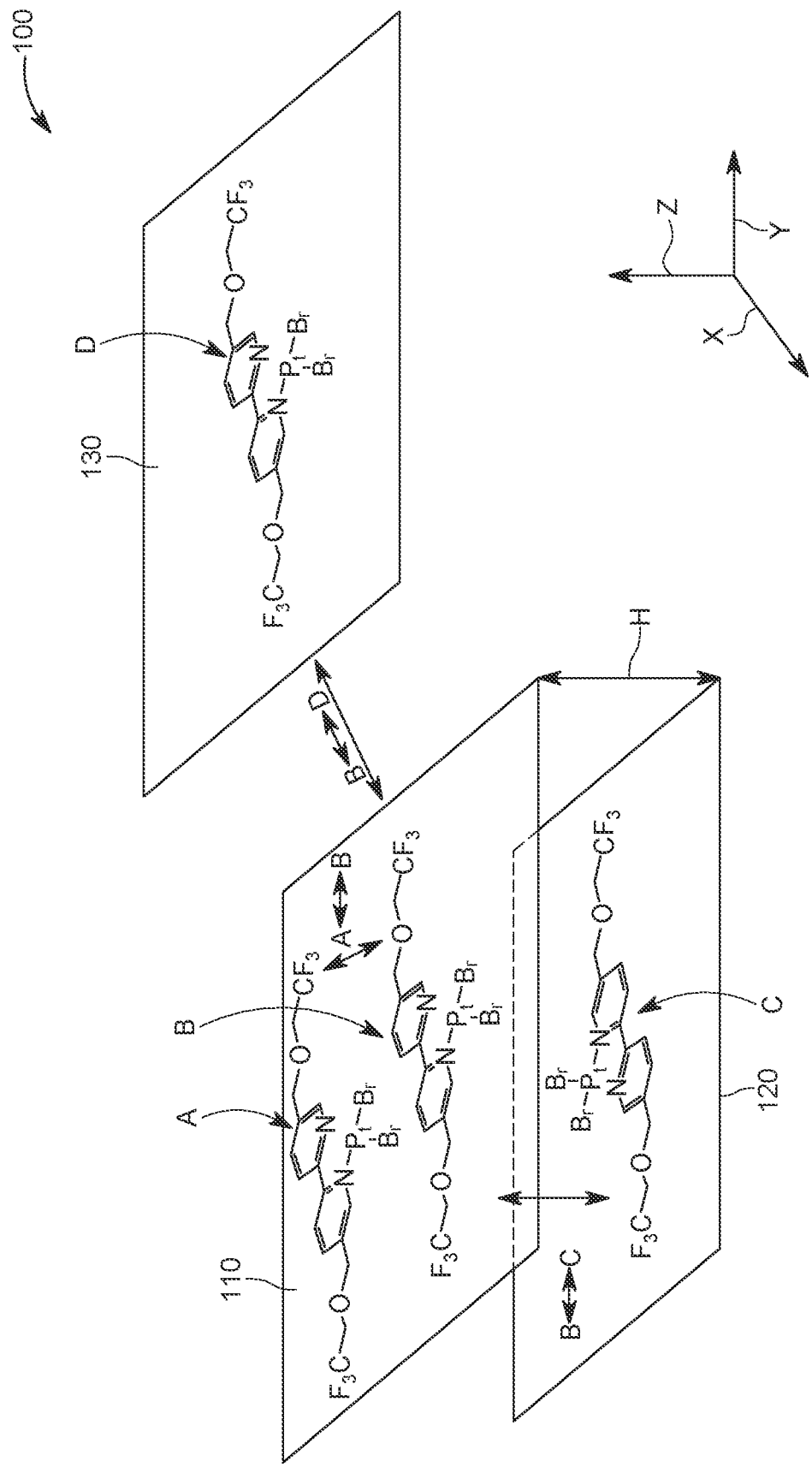
FIG. 1 is a schematic diagram of a single-crystal linear-chain polyfluorinated dibromo-platinum(II) diimine complex.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a single-crystal linear-chain polyfluorinated dibromo-platinum(II) diimine based photodetector. However, the embodiments to be discussed next are not limited to a photodetector, but may be applied to other optical devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Due to the limitations of the organic materials currently used in the PD, single crystals of organic semiconductors are believed to be the solution for modern organic electronic devices due to their reduced trap density and lack of grain boundaries, thus avoiding the carrier scattering phenomena and greatly improving the device mobility and viability [1-3]. The use of single crystals would significantly improve the electronic performance of organic PDs, but the challenge is the stability of these materials, which remain inferior to that of the inorganic semiconductors. Devices based on organic single crystals (such as hexacene, pentacene, and tetracene) significantly degrade upon exposure to air and/or moisture, leading to short device lifetimes. For example, the lifetime of a single-crystal hexacene transistor without encapsulation is only about 19 days. Similarly, the pentacene suffers from photo-oxidation and quickly degrades to form transannular endoperoxides when exposed to light and oxygen in a solution medium. Additionally, devices made using n-type organic semiconductors always display poorer stability than the p-type devices because the electrons in the n-type devices are more prone to trapping processes when exposed to water and air due to the mismatched energy band alignment.

Encapsulating the device with a high-barrier material can help shield the organic semiconductor from the environmental effects; however, this step adds to the complexity of the device fabrication, which is undesirable. Therefore, it is a challenge in the PD industry to simultaneously achieve the various advantages of the organic semiconductors, including their low-cost fabrication, high photosensitivity, fast response speed, long-term stability, and high charge carrier mobility within a single device.

No matter what type of materials and processing techniques are used, the success of organic materials-based devices ultimately relies on two factors: (1) the charge carrier mobility and (2) the stability under ambient and extreme conditions, which determine the overall device performance. With these targets in mind, current research efforts have aimed to develop highly stable n-type organic materials that can work under such conditions by engineering the crystal structure [4]. This involves designing and synthesizing functional molecular solid-state structures and intermolecular interactions to achieve a high mobility for targeted applications. A first approach involves the use of organic semiconductors with a lamellar molecular structure, which benefits charge carrier transport and thus improved mobility [4]. However, such lamellar organic structures have been associated with poor stability under ambient conditions. To overcome this limitation, a second approach involves the incorporation of fluorine atoms into the organic molecular structure, which not only promotes air stability, but also greatly improves the material's water-repellent properties, making the lamellar organic semiconductor highly stable in ambient conditions without sacrificing its mobility [4-11].

Applying these approaches, the inventors have recently developed [12, 13] a linear-chained single-crystal organic semiconductor featuring lamellar structure and fluorine-containing segments, and this compound is called herein [PtBr$_2$(5,5'-bis(CF$_3$CH$_2$OCH$_2$)-2,2'-bpy)] or "single-crystal linear-chain polyfluorinated dibromo-platinum(II) diimine complex," or the "Pt complex (1o)" for simplicity. The crystal structure of the Pt complex (1o) 100 is shown in FIG. 1 having plural crystals distributed in plural planes 110, 120, and 130. More specifically, FIG. 1 shows a single crystal Pt complex (1o) 100 having two crystals A and B distributed in a first plane 110, a third crystal C distributed in a second plane 120, which is parallel to the first plane 110, and a fourth crystal D distributed in a third plane 130. The planes 110, 120, and 130 are called herein molecular planes as the molecules of the dimers are substantially located within these planes. These planes, which are substantially parallel to each other, indicate that the molecular structure of the complex 100 is lamellar, i.e., the molecules of the complex 100 extend along these planes/lamellas. A vertical distance H between the first and second planes 110 and 120 is H. The third plane 130 may be situated, along the Z axis, at a position that is different from the z axis positions of the first and second planes. Those skilled in the art would understand that the single crystal Pt complex (1o) 100 can have many more planes and/or crystals. Only three planes and four crystals are shown in FIG. 1 for simplicity. The single crystal Pt complex (1o) 100 is shown to include atoms of C, H, O, F, N, Pt, and Br, with the C and H atoms forming an aliphatic component, i.e., there are no aromatic C components. The detail structure of a single crystal is discussed later.

According to an embodiment, there is a PDs based on the single-crystalline, polyfluorinated Pt complex (1o) 100. This structure renders the PD device to have a high field-effect mobility of up to 0.45 cm$^2$V$^{-1}$s$^{-1}$ at a threshold voltage as low as 1.12 V. Benefiting from the lamellar molecular structure and incorporation of fluorine groups, the device also exhibits long-term stability in air and distilled water. Additionally, the device's structure exhibits a photoresponsivity of 1000 A W$^{-1}$, an ON/OFF ratio of 16, a response/recovery time of 80/90 μs, and polarization sensitivity, thereby demonstrating its stable and fast photo-switching capability. Thus, the embodiments to be discussed next demonstrate the potential of a new generation of fast, stable, and water-resistant PDs based on polyfluorinated, single-crystal, organic materials with impressive consistency and long-term repeatability.

Figure 2:
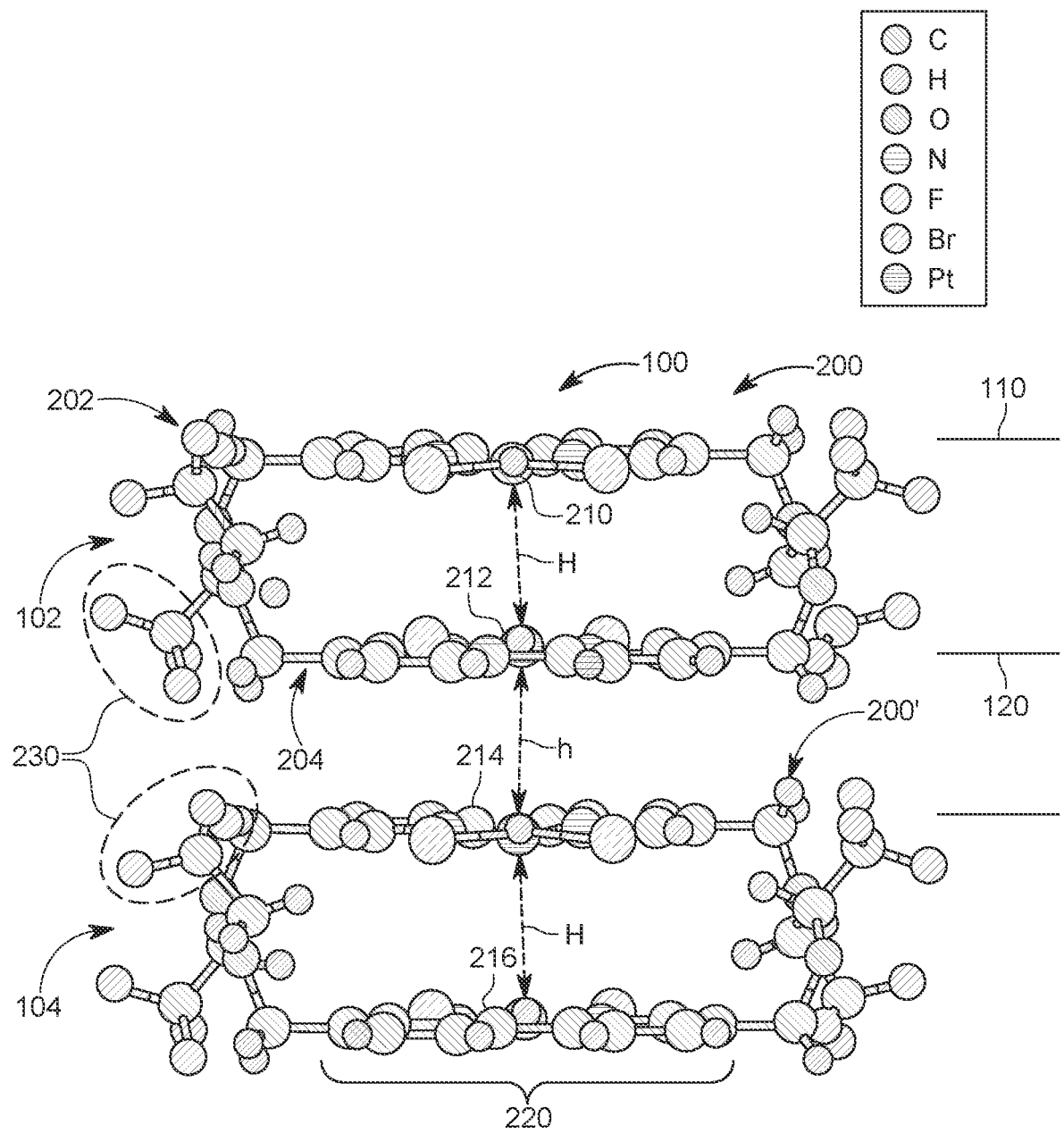
FIG. 2 is a schematic diagram of the monomers forming the single-crystal linear-chain polyfluorinated dibromo-platinum(II) diimine complex.

FIG. 2 shows the single-crystal structure of the polyfluorinated Pt complex (1o) 100 based on X-ray diffraction (XRD) spectroscopy. The crystalline Pt complex (1o) 100 has a lamellar molecular structure (that extends along the various planes 110 to 130 shown in FIG. 1) with a quasi-linear Pt . . . Pt . . . Pt chain that is formed by two neighboring Pt metal atoms 210 and 212 or 214 and 216, which are located at the center of two different dimers 200 and 200', each dimer being formed of two monomers 202 and 204. The Pt—Pt atoms distance H is 3.590 Å within the dimer-pair unit 200 and h=3.619 Å between the two closest neighboring dimers 200 and 200', as shown in FIG. 2. FIG. 2 also shows the specific structure of each dimer, with the relative positions among the atoms of C, H, O, N, F, Br, and Pt illustrated. The strong supramolecular interactions of Pt . . . Pt . . . Pt among the dimer pairs 200 and 200' lead to the linear-chain-like structure (see atoms 210, 212, 214, and 216) in which the Pt . . . Pt . . . Pt angle is up to 168°. In addition, the Pt complex (1o) 100 has bulky fluorine-containing side chains 230 substituted at the 5,5'-positions of the 2,2'-bipyridine ligand 220.

Figure 3:
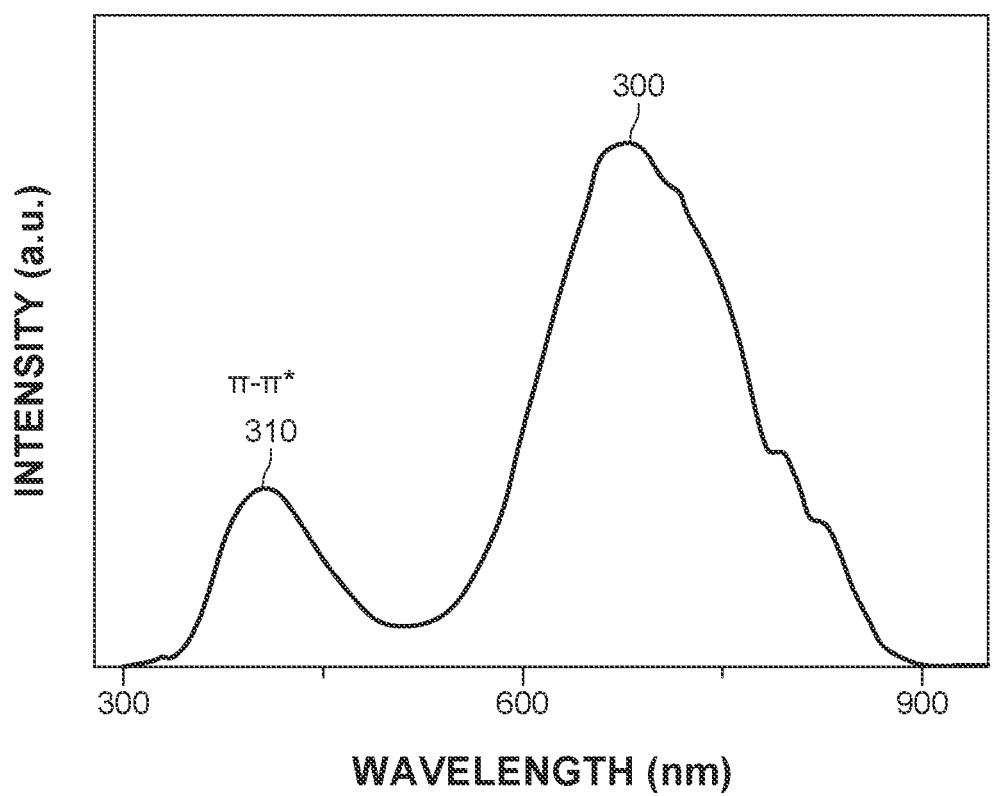
FIG. 3 illustrates the photoluminescence spectrum of the single-crystal linear-chain polyfluorinated dibromo-platinum(II) diimine complex.

To reveal the energy transition dynamics of the Pt complex (1o) 100, the inventors have measured the photoluminescence (PL) spectrum of the material with an excitation wavelength of 325 nm at room temperature, as shown in FIG. 3. The lowest-energy excited state peak 300 was observed at 675 nm and can be mainly assigned to the metal-to-ligand charge transfer (MLCT) transition (an electron transition from the metal to ligand molecular orbitals), which is consistent with previous observations based on other Pt(II) complexes. The peak 310 at about 400 nm also confirms the π-π* transition from the bipyridyl ligand moiety in the organic crystal. Thus, the crystal structure of the Pt complex (1o) 100 adopts both a 1D linear chained wire and a lamellar molecular structure with 2D π-π stacking, providing a large transfer integral that should result in a high mobility.

Figure 4A:
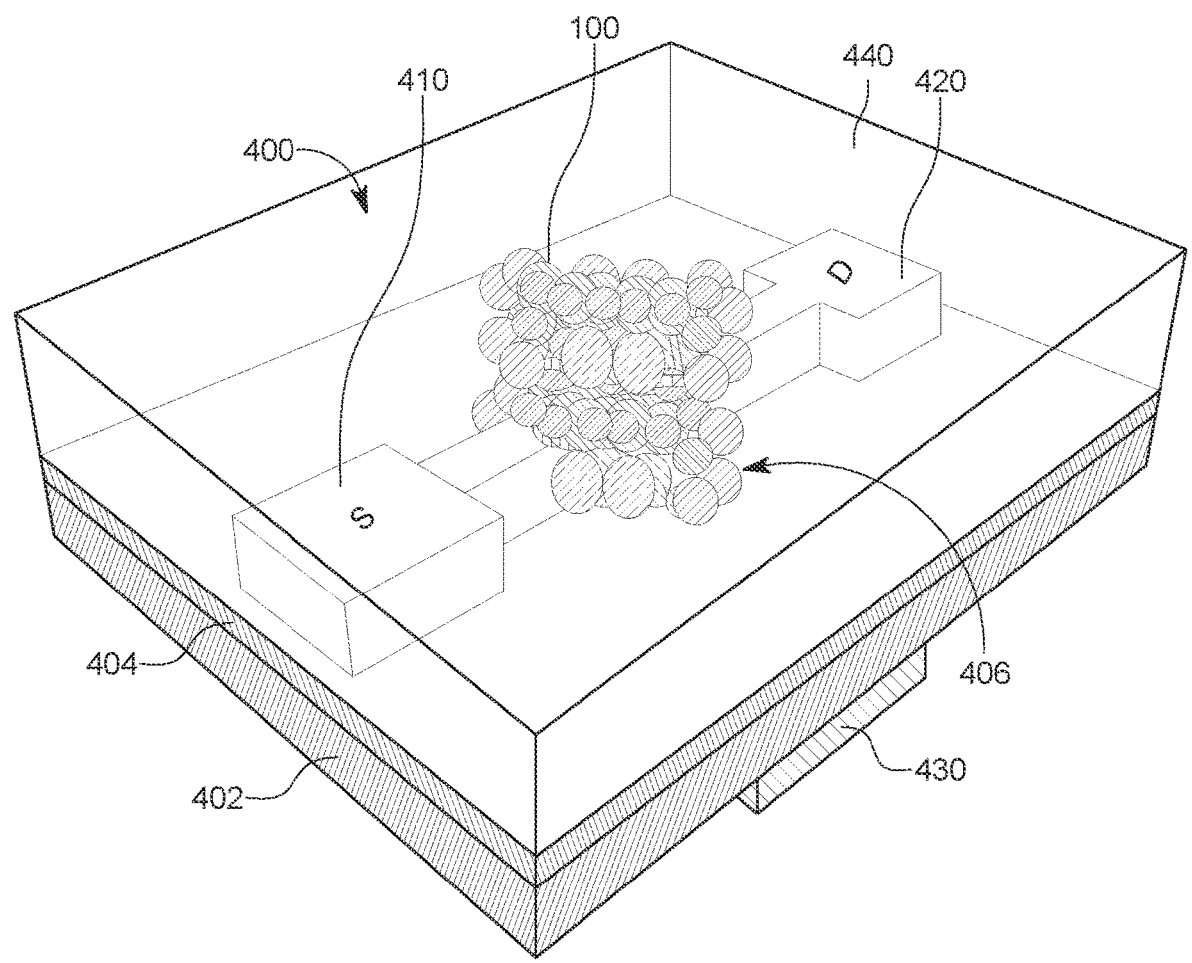
FIGS. 4A and 4B illustrate a photodetector or phototransistor that uses the single-crystal linear-chain polyfluorinated dibromo-platinum(II) diimine complex as the active material.
Figure 4B:
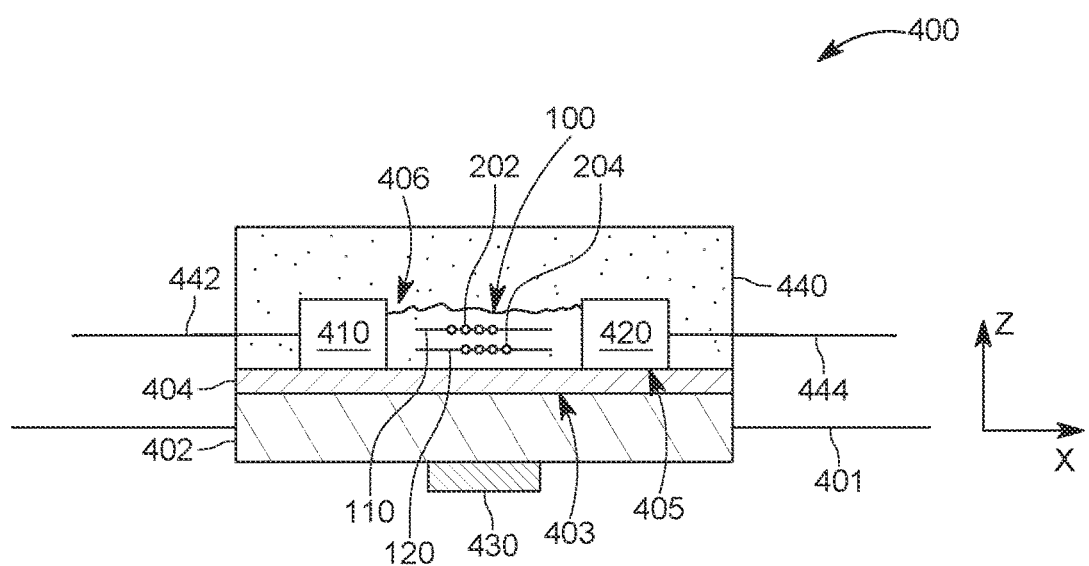

FIGS. 4A and 4B display a schematic diagram of the fabricated PD device 400, in which the Pt complex (1o) 100 serves as the active semiconductor material. The active semiconductor material 100 is deposited on a Si substrate 402, on which a SiO layer 402 was deposited. Two electrodes 410 and 420 are also formed on the SiO layer 402 and they sandwich the Pt complex (1o) 100. The PD device 400 uses aliphatic, fluorine-containing side chains, linear-chained single crystals, with Pt . . . Pt . . . Pt interactions, and an MLCT transition.

Figure 5:
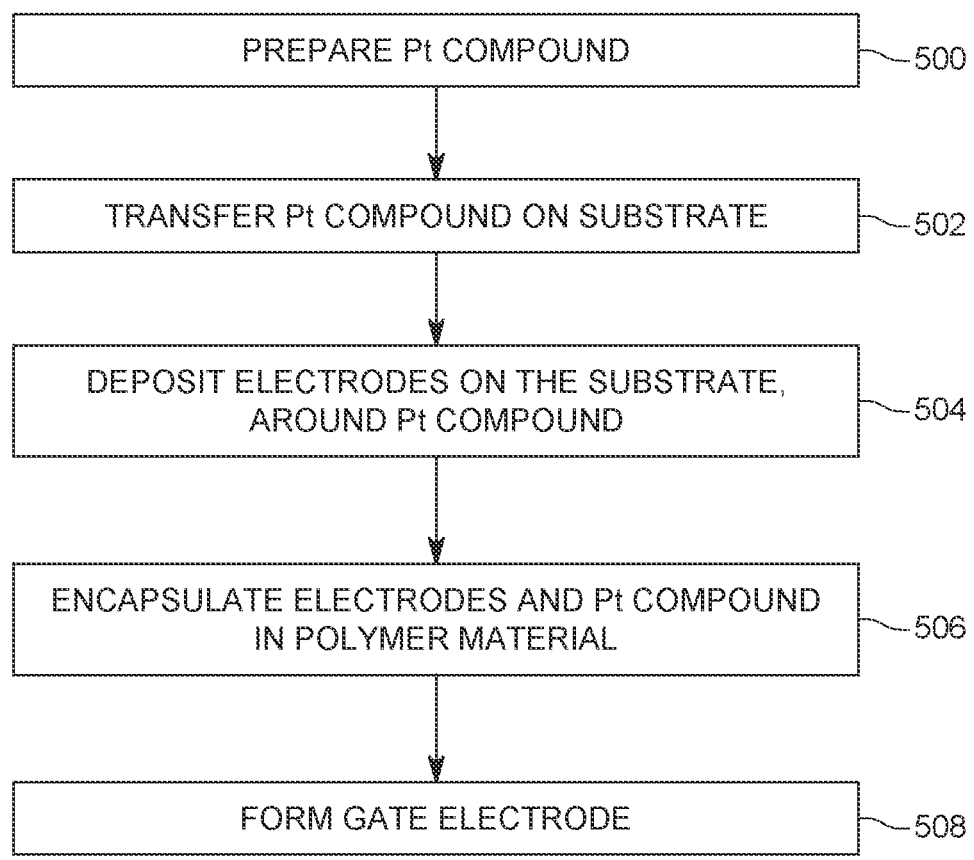
FIG. 5 is a flowchart of a method for forming the single-crystal linear-chain polyfluorinated dibromo-platinum(II) diimine complex.

The preparation of the polyfluorinated, Pt complex (1o) 100 is described in [12] and is briefly described herein with regard to FIG. 5. First, equimolar amounts of the fluorinated bipyridine (bpy) ligand, (5,5'-bis(CF$_3$CH$_2$OCH$_2$)-2,2'-bpy) (197.6 mg, 0.52 mmol) and K$_2$PtBr$_4$ (308.3 mg, 0.52 mmol) were added to a container. Then, 3 mL of dried dimethylformamide (DMF) was added as a solvent. After mixing the solution for several minutes, the color changed from red to yellow. Following this, the solution was stirred at 70° C. for 4 h before the solvent and volatiles were removed by distillation. The resultant orange solid was further washed with ether to obtain a spectroscopically pure product (i.e., no impurities). In the DMF solution, the resulting complexes were orange in color. By diffusion crystallization, orange red crystals can be obtained.

Figure 6:
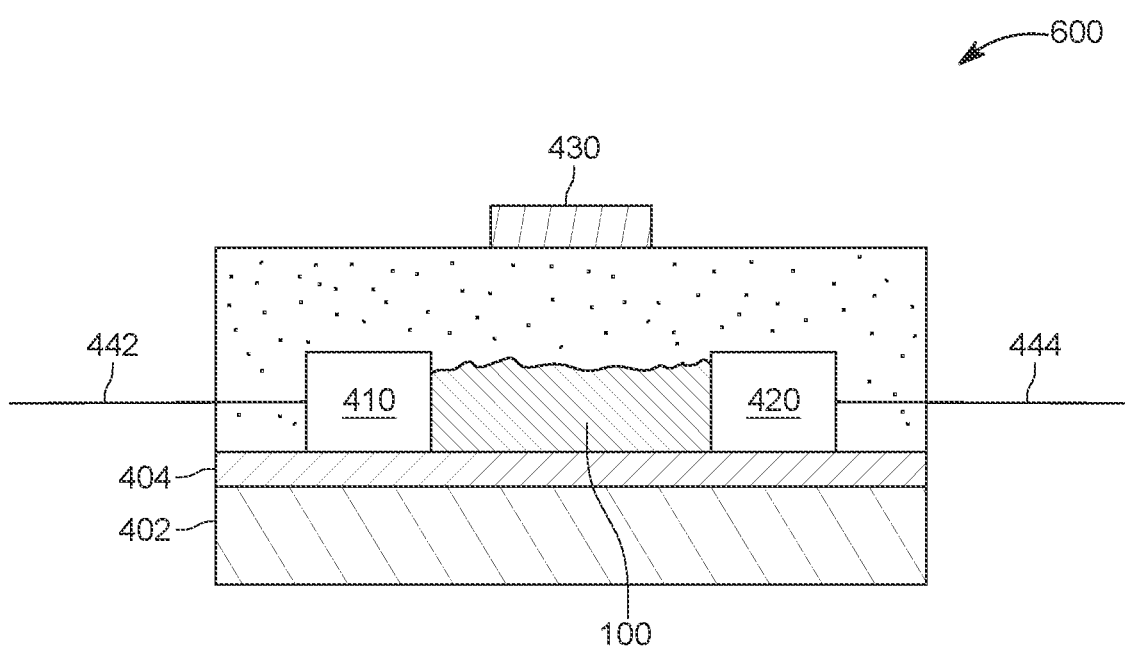
FIG. 6 shows another device that uses the single-crystal linear-chain polyfluorinated dibromo-platinum(II) diimine complex as the active material.

The PD device 400 based on the single-crystal Pt compound 100 has been fabricated as follows. The single-crystal Pt compound 100 (about 80 µm$^2$) was prepared in step 500 as noted above. The single-crystal Pt compound 100 was then transferred in step 502, onto a thoroughly cleaned, heavily doped Si wafer 402, which was capped with a 90 nm thick SiO$_2$ or other dielectric material 404, using the mechanical transfer method. A backgated FET geometry was constructed in step 504, by making top Ti/Au (20 nm/80 nm) as Ohmic electrodes 410 and 420, which were deposited by electron-beam evaporation and defined by the e-beam lithography process. The Ti/Au electrodes were patterned (e.g., directly on the dielectric 404) such that a channel 406 between the electrodes 410 and 420, where the Pt complex 100 was transferred, was aligned parallel to the molecular plane direction (side-to-side-type dimer), which is the most favorable direction for electron transport in the single-crystal Pt complex. In step 506, a polymer material 440 was deposited over the electrodes 410 and 402 and the Pt complex 100, to encapsulate these elements and further protect them from the environment. Besides forming the electron-beam evaporation electrodes 410 and 420 on one side of the substrate 402, a gate electrode 430 could be made in step 508, e.g., painted, on the crystal surface of the substrate 402, for example, on the opposite side of the electrodes 410 and 420, with conductive silver ink, as shown in FIG. 4B, or directly onto the polymer material 440, as shown in FIG. 6. Other methods for making the gate electrode may be used. FIG. 4B shows how the monomers 202 and 204, which extend along planes 110 and 120, respectively, are transferred on the dielectric 404 so that they are parallel to the plane 401 in which the dielectric layer 404 and/or the substrate 402 extend. In other words, the molecular surface (or the lamellar molecular surface) of the monomers 202 and 204 is parallel to the largest surface 405 of the dielectric 404 and the dielectric is formed over the largest surface 403 of the substrate 402. The surfaces 403 and 405 are parallel to the plane 401, which extends in the cartesian plane XY in FIG. 4B. Leads 442 and 444 were attached to the electrodes 410 and 420. Various other layers may be formed, as for example, an antireflective layer.

To validate the feasibility of the Pt complex (1o) 100 for the PD device 400 or 600, in-depth electronic, optoelectronic, and stability studies were performed for these devices, including the following characterization of the materials: i) temperature-dependent electrical transport, ii) field-effect mobility and stability, iii) water-repellant properties, iv) photoresponsivity, v) photoresponse and recovery time, and vi) polarization-dependent photodetection.

Figure 7:
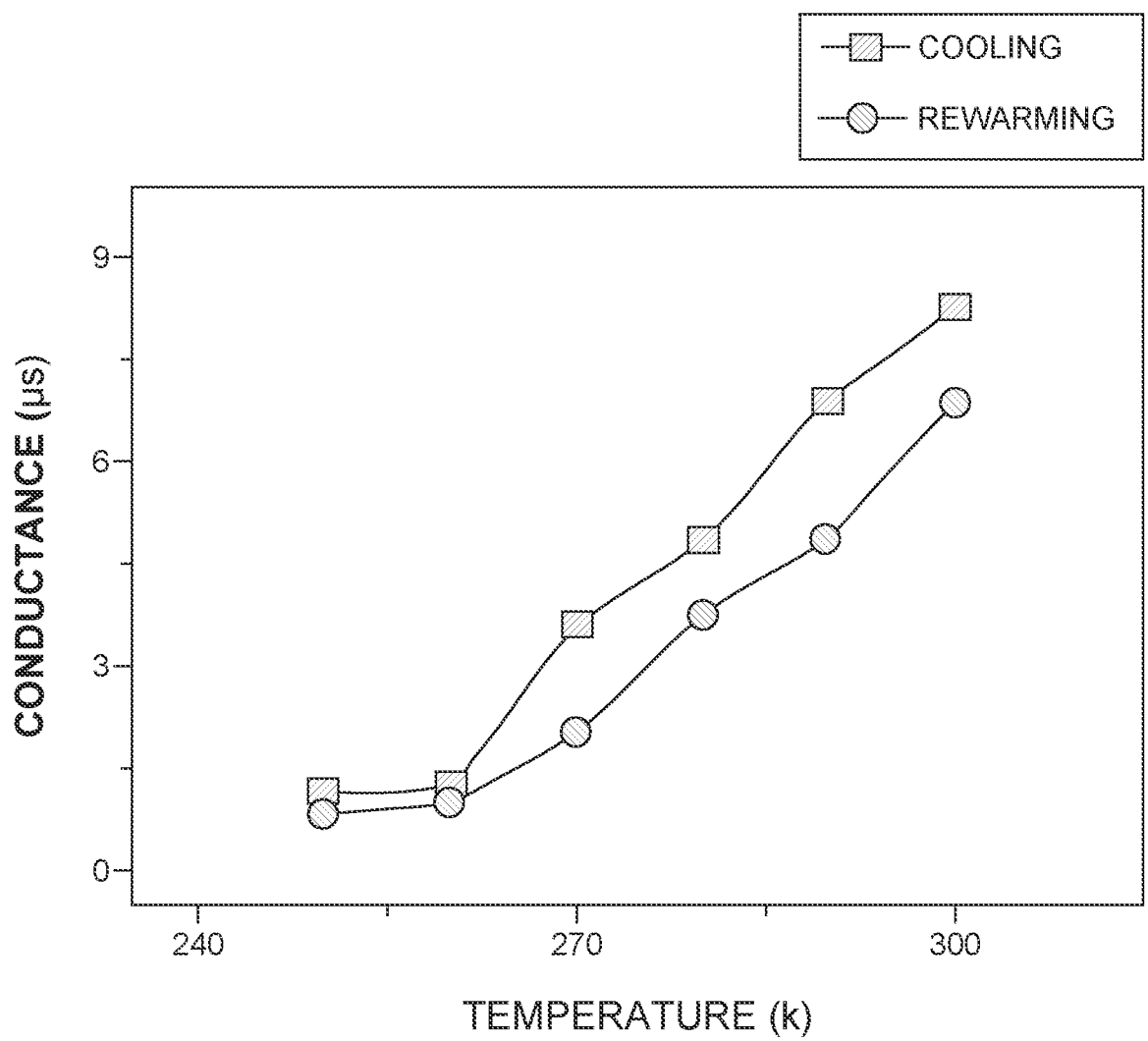
FIG. 7 illustrates the temperature-dependent conductivity of the single-crystal linear-chain polyfluorinated dibromo-platinum(II) diimine complex.

To determine the electronic nature of the poly-fluorinated, single-crystal Pt complex (1o) 100, the electrical conductance at different temperatures was measured, as illustrated in FIG. 7. It was observed a clear trend of an increasing conductance with the temperature (from 250 to 300 K), indicating the excellent semiconducting behavior of the Pt complex (1o) crystal. Note that the lamellar molecular structure (which provides a strong electronic coupling for both electrons and holes), MLCT, and oxidation states of the metal are the primary factors responsible for the semiconducting behavior, as well as the high conductivity of the fluorinated Pt complex (1o) crystals. Even though this polyfluorinated Pt complex (1o) 100 is a thermally stable crystal, it was observed that it undergoes a phase change when the temperature is below 250 K. Therefore, the temperature-dependent measurements were performed from 250 to 300 K to avoid the phase change.

To obtain an in-depth understanding of the characteristics of the single crystal A of the Pt complex 100, a theoretical study of the transfer integral calculation has been performed. This parameter, which governs the charge transport in the Pt complex (1o) 100, was obtained for different axes (A-B, B-C, and B-D) of the crystals A to D, as illustrated in FIG. 1. The calculated values for the transfer integral were found to be 17.7 for the electrons and 3.0 for the holes (measured in milli electron volt) along the A-B direction, 19.7 for the electrons and 65.0 for the holes, along the B-C direction, and 0.6 for the electrons and 0.0 for the holes, along the B-D direction. These results reveal that the charge transport in the single-crystal Pt complex (1o) 100 is direction dependent, and the high transfer integral for electrons suggests that the electron transport is expected to favorably proceed along the direction parallel to the molecular packing (side-to-side dimer). For this reason, the single-crystal Pt complex (1o) 100 needs to be arranged between the electrodes 410 and 420 so that the planes 110, 120 are parallel to the largest surface 403 of the substrate 402.

In addition, as the crystal exhibits different electronic couplings along different axes, it is also predicted that the single-crystal Pt complex (1o) 100 may behave as an ambipolar semiconductor with high electron (hole) conductivity in the in-plane molecular (π-π stacking) direction. This also indicates the excellent semiconducting property of the Pt complex (1o) 100, and its electronic properties can be varied by tuning its molecular structure.

Figure 8:
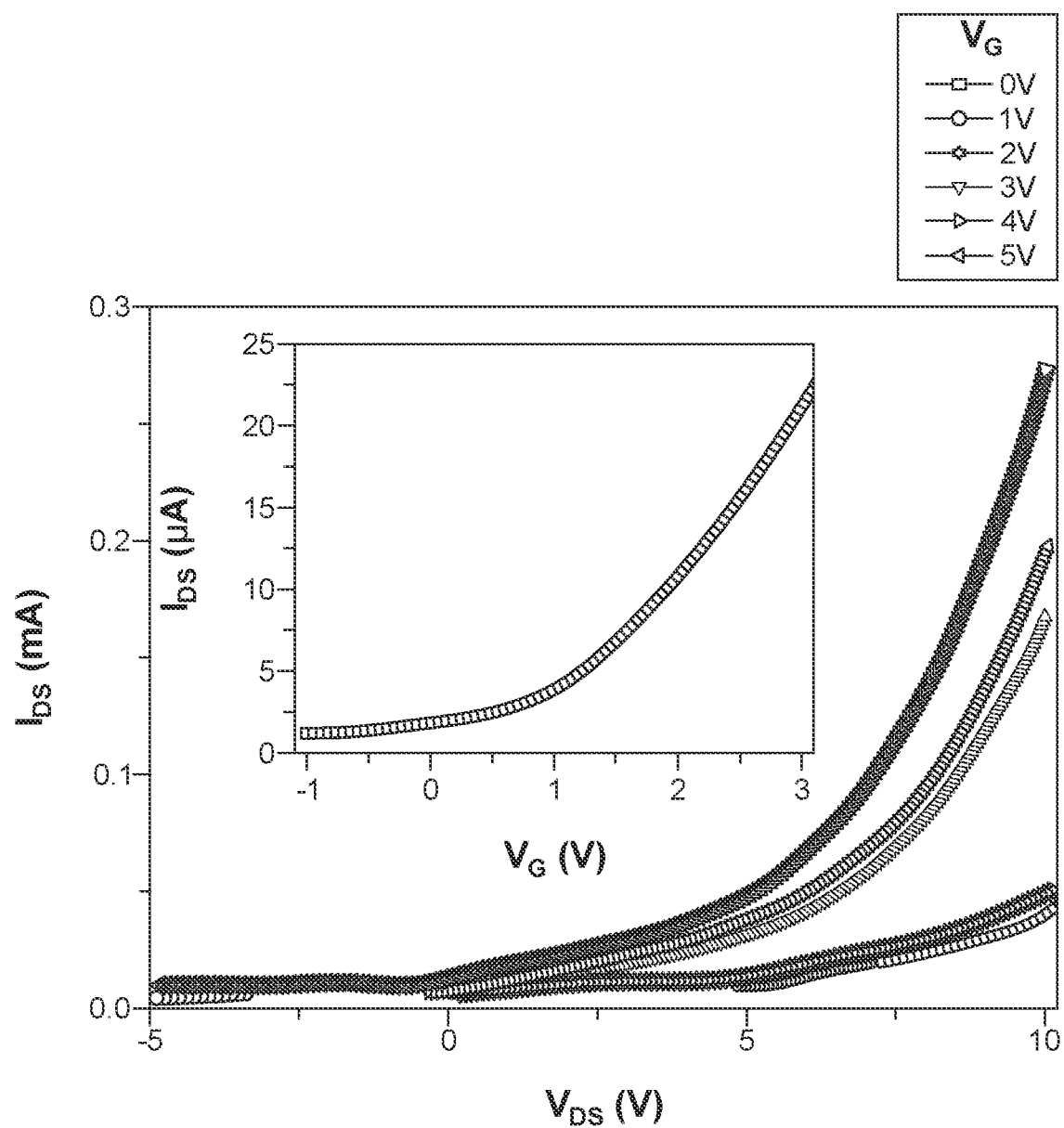
FIG. 8 illustrates the current-voltage characteristics of the single-crystal linear-chain polyfluorinated dibromo-platinum(II) diimine complex.

FIG. 8 shows the current versus voltage, $I_{DS}$-$V_{DS}$ characteristics of the Pt complex (1o) based PD device 400 at different gate voltages in the dark. The charge transport characteristics of the device were measured in the in-plane molecular direction (along side-to-side type dimer). The drain current of the device was well controlled and tunable by the gate voltage applied at electrode 430. The behavior of the device 400 exhibits in FIG. 8 field-effect transistor (FET) device operation (as shown in the inset of the figure).

The device 400 displays n-type semiconductor behavior with a mobility (μ) of 0.45 $cm^2V^{-1}s^{-1}$ at a threshold voltage as low as 1.12 V, estimated according to the formula:

$$\mu = \left(\frac{L}{WC_gV_{DS}}\right)\left(\frac{dI_{DS}}{dV_G}\right), \quad (1)$$

in which Cg is the capacitance per unit area of the insulating gate, L is the channel length, W is the channel width, $V_G$ is the gate voltage, and $I_{DS}$ is the source-drain current. The mobility value is higher than that of other quasilinear-chain complexes, such as [Pt—$(NH_2dmoc)_4$][$PtCl_4$], which features a mobility between 0.01 and 0.1 $cm^2V^{-1}s^{-1}$, and the n-type, single-crystalline, $F_{16}$CuPc, which features a relatively low mobility of about 5.32×$10^{-4}$ $cm^2V^{-1}s^{-1}$.

It has been reported in the literature that devices based on n-type materials (p-type) display poor (superior) charge transport characteristics due to mismatched (well-matched) band alignment between the work function of noble non-oxidant metals and the lowest unoccupied molecular orbital (LUMO) or highest occupied molecular orbital (HOMO) of the n-type or p-type semiconductor, respectively, resulting in low or high mobility, respectively. Despite these observations, the high electron mobility observed in the PD device 400 is attributed to the following three reasons.

First, employing a lamellar structure with strong supramolecular interactions contributes to the increase of the transfer integral as the molecules are packed in such a way that charge carrier transport is facilitated over a straight line. This provides the shortest route for efficient charge transport within the crystal as the organic molecules are packed along the direction of the current flow, resulting in a high mobility. Further, as discussed with regard to FIG. 1, the theoretical calculations of the transfer integral reveal the larger intermolecular electronic coupling (transfer integral) for electrons (17.7 meV) along the side-to-side-type dimer, which might validate the observed high electron mobility toward the charge transport direction in the channel.

Second, the substitution of the electron-withdrawing element (—F—) into the semiconductor and/or the $d_z^2$ and $d_z^2$ orbital interactions of the Pt atoms from the linear Pt . . . Pt . . . Pt chain lowers the LUMO level, facilitating a barrier-free transport toward high mobility.

Third, the Pt complex (1o) 100's ideal single-crystalline structure minimizes charge traps, eliminates grain boundaries, and provides highly stable chemical properties, which allows the material to display its intrinsic material characteristics, including a higher mobility compared to the polycrystalline or other organic semiconductors.

Figure 9:
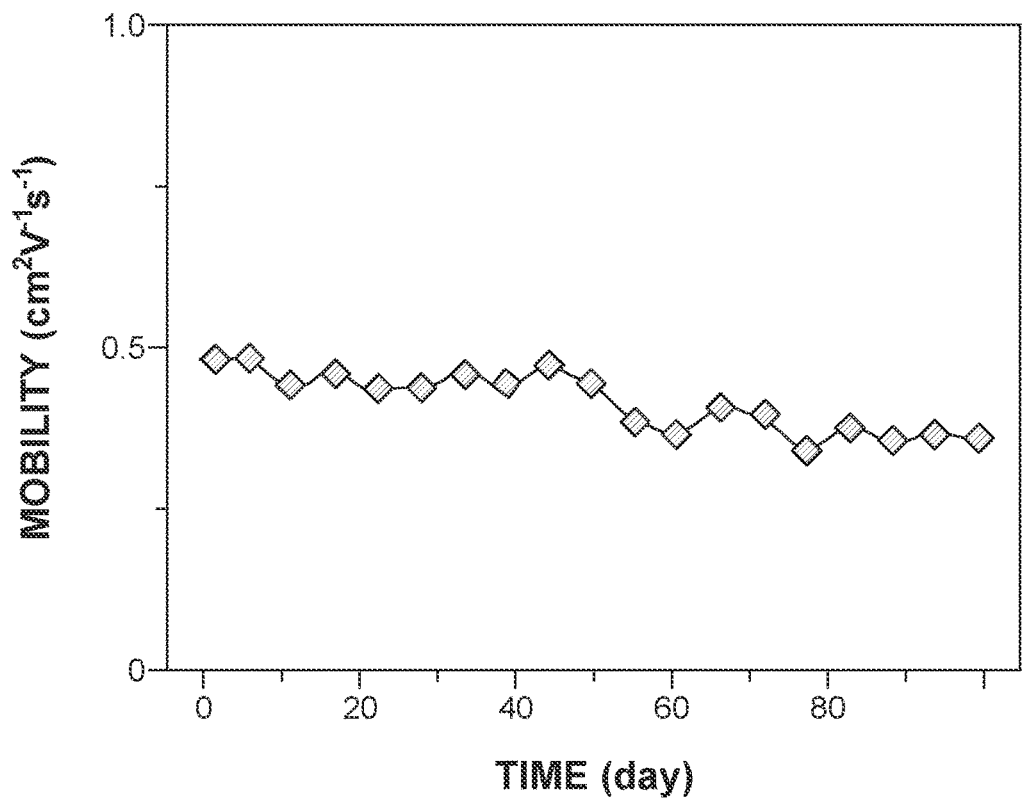
FIG. 9 illustrates the time-dependent mobility of the single-crystal linear-chain polyfluorinated dibromo-platinum(II) diimine complex.

As the operation of the organic optoelectronic devices strongly depends on their electrical stability over time, the stability of the field-effect mobility has been investigated. Therefore, the time-dependent performance/decay of the Pt complex (1o) PD device 400 has been measured, as shown in FIG. 9. No obvious degradation was observed over a period of 40 days, even without encapsulation under ambient conditions, with an average mobility of about 0.45 $cm^2V^{-1}s^{-1}$, indicating the remarkable electrical stability of the Pt complex (1o) 100. The crystal's high stability and low threshold voltage can be ascribed to the absence of charge traps at the interface between the Pt complex (1o) crystal 100 and the gate dielectric 404, as well as the material's ideal crystal geometry.

The Pt complex (1o) crystal 100 does not contain any —OH groups to act as charge-trapping sites, which can lead to the degradation of the device over a long period of operation. However, after 90 days, as also shown in FIG. 9, the mobility gradually decreases from 0.45 to 0.35 $cm^2V^{-1}s^{-1}$ (≈22%) as a result of a mild degradation in the dielectric/channel interface and the crystalline quality of the channel material in atmosphere. Precise control of the surface characteristics of the gate dielectric 404 will greatly improve the interface quality and consequently optimize the FET behavior of the PD device 400. In addition, as the molecular tunability of the Pt complex (1o) 100 provides the opportunity for a new molecular design, the mobility (or electrical stability) of the device may be further improved by controlling the fluorine substitution.

Figure 10:
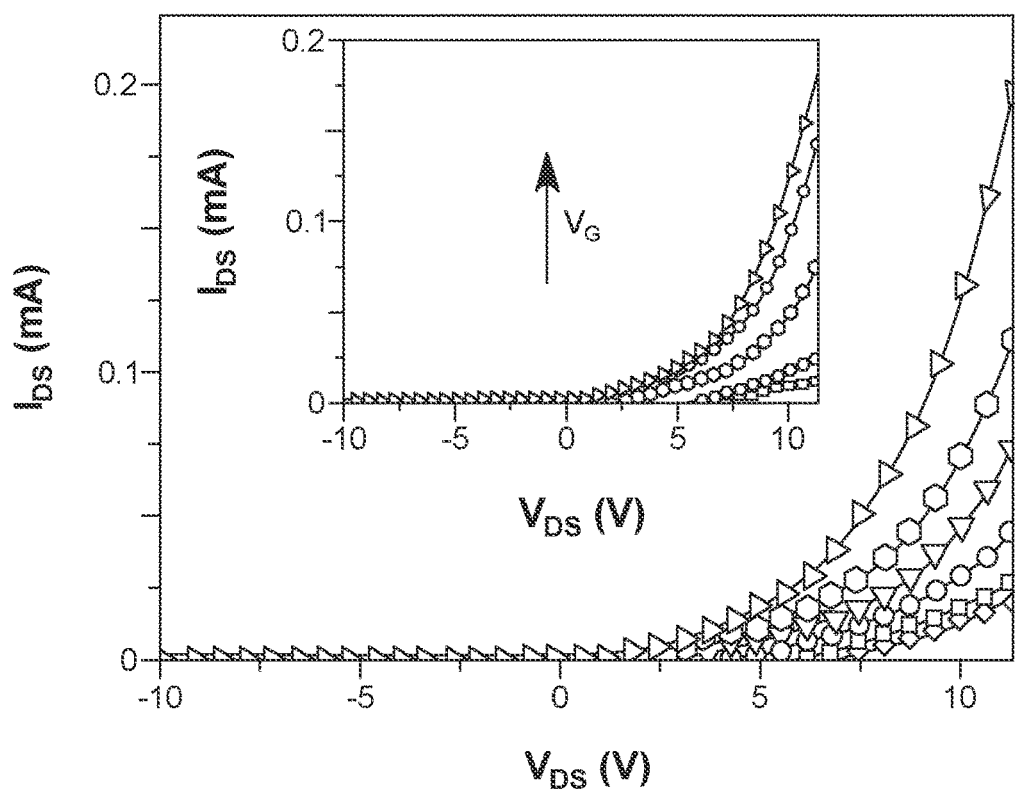
FIG. 10 illustrates the current-voltage characteristics of the single-crystal linear-chain polyfluorinated dibromo-platinum(II) diimine complex after stored in water for 24 h.

Next, the water-tolerance ability of the single-crystal Pt complex (1o) 100 was investigated. For this investigation, the unpackaged device 400 was immersed in distilled water for a period of 24 h. It is noted that only a very small decrease (about 5.7%) in the field-effect mobility was observed (see FIG. 10) due to the gradual removal of ionic impurities by the water. This indicates the high stability of the Pt complex (1o) PD 400 in water, which is ascribed to the water-repelling properties of the incorporation of the fluorine-containing groups 230. In this regard, the high electronegativity of the fluorine blocks the polarization of the atom causing hydrophilicity, which features the fluorocarbons to have low intermolecular attractive forces (i.e., van der Waals forces), which strictly prohibit the water to be adsorbed on its surfaces. Furthermore, as compared to the traditional organic semiconductor devices (such as those based on hexacene and pentacene), which feature lifetimes as low as 19-30 days despite high mobilities (0.4-5 cm$^2$V$^{-1}$s$^{-1}$), the novel device 400 demonstrates a stable performance even under extreme conditions, including more than 90 days in air and 24 h in water. These results indicate that even under extreme conditions, the single-crystal polyfluorinated (1o) compound 100 can function normally and stably. Also note that the tested device displays comparable performances with only a nominal variation of ±10% over more than 10 crystal samples.

Figure 11:
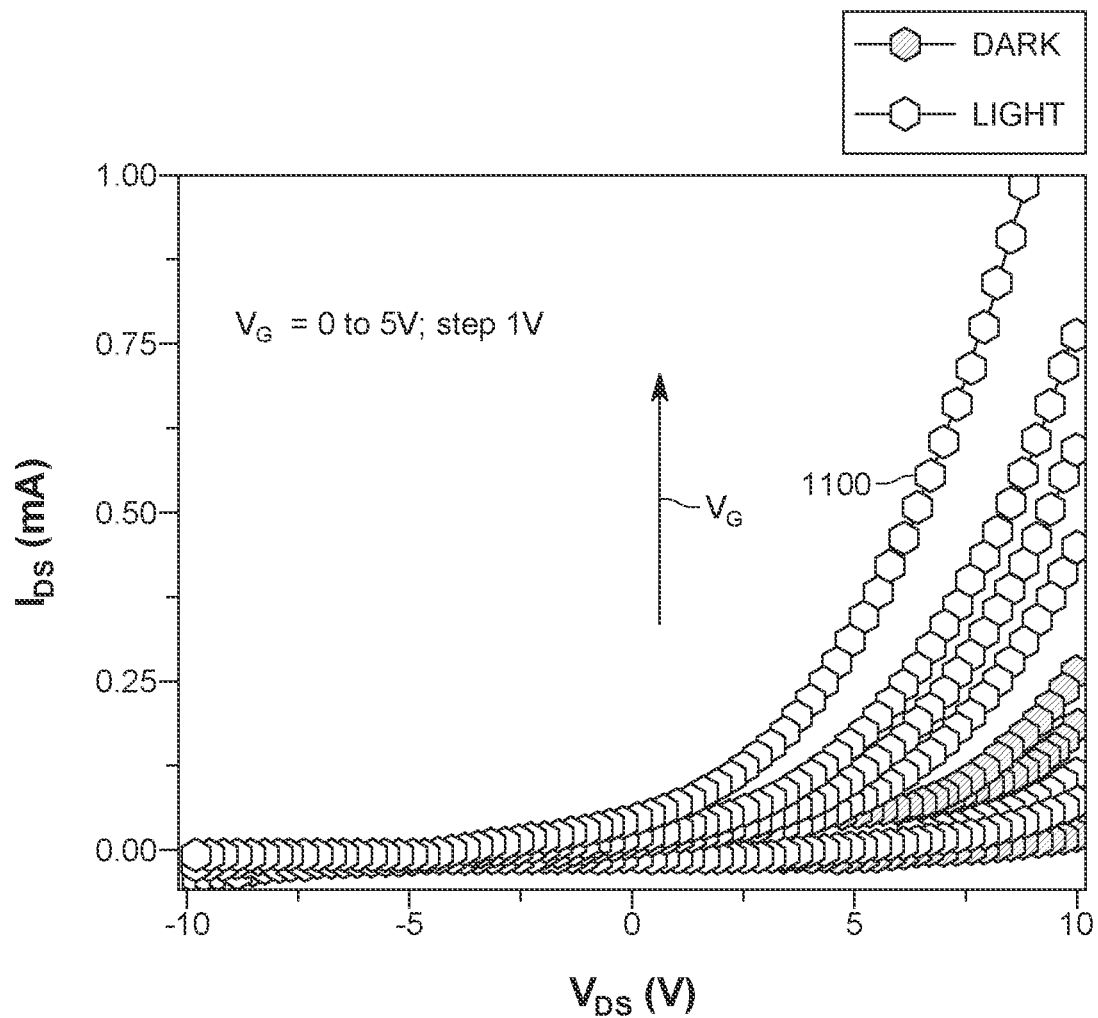
FIG. 11 illustrates the current-voltage curve of the single-crystal linear-chain polyfluorinated dibromo-platinum(II) diimine complex measured in the dark and under a given illumination.

To investigate the ability of the device 400 to respond to light, the dynamic photo-response was measured under 532 nm illumination (25 mW cm$^{-2}$) at atmospheric conditions and different gate voltages. An unexpected increase in the drain current under illumination was observed, as shown in FIG. 11, indicating that the absorbed photons are effectively converted into the photocurrent. Furthermore, the device 400 shows strong field-dependent properties, i.e., the drain current under illumination increases with increasing the gate voltage as a result of the increasing number of photoexcited carriers with the applied electric field, yielding typical organic phototransistor characteristics.

To further investigate the practicality of the device 400, the photoresponsivity (R) of the device was measured based on the equation:

$$R = \frac{I_{DS,ill} - I_{Ds,dark}}{A \times P_{in}}, \quad (2)$$

in which Pin is the incident optical power per unit area of the device, $I_{DS,ill}$ and $I_{DS,dark}$ are the source-drain currents with and without illumination, respectively, and A is the effective area of the device.

The device 400 exhibited a photoresponsivity 1100 (see FIG. 11) as high as 1000 A W$^{-1}$ at 5 V bias, which is much higher than that of pentacene-based PDs (which is widely regarded as a standard p-type organic semiconducting material), F$_{16}$CuPc (which is the well-known n-type organic semiconductor material) organic phototransistors, and even than the single-crystalline silicon. The high responsivity of the polyfluorinated Pt complex (1o) PD device 400 may be due to its high mobility, efficient carrier collection due to its lack of grain boundaries and/or high defect density, and, most importantly, its ideal crystal geometry. In other words, the photoresponsivity of the PD device 400 can be ascribed to the advantages of the well-ordered lamellar molecular structure that permits the transport of photocarriers at high speed.

To further understand the photodetection capability of the Pt complex (1o) semiconductor material 100, the detectivity (D*, i.e., the minimum optical signal distinguished above the noise) of this material was calculated using Equation (3):

$$D^* = \frac{A^{1/2}R}{\sqrt{2qI_d}}, \quad (3)$$

in which Id is the dark current and q is the electronic charge. The detectivity of the device 400 was calculated to be 1.1×10$^{12}$ cmHz$^{1/2}$W$^{-1}$ at 5 V, demonstrating its practicality for many applications. It is noted that the performance of the Pt complex (1o) 100 can be further enhanced by suppressing the dark current via new crystal engineering, thus potentially offering a way to improve the responsivity and detectivity of the device 400.

Figure 12:
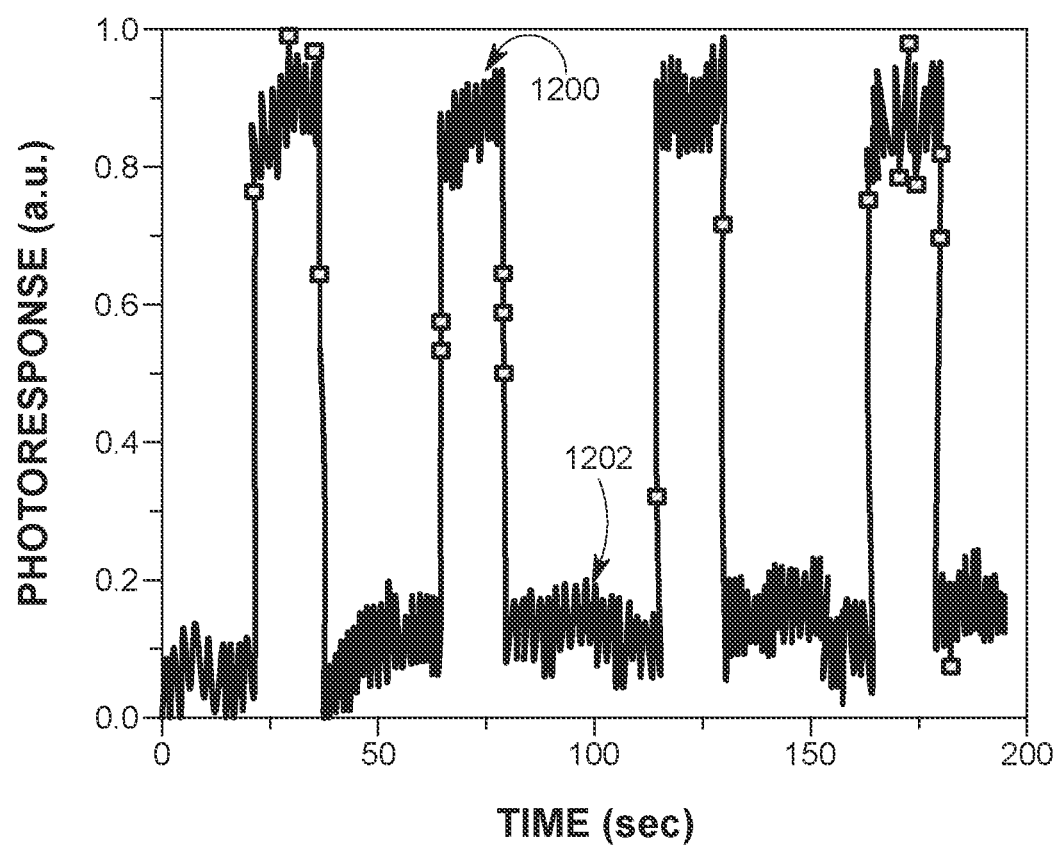
FIG. 12 illustrates the photocurrent as a function of time in the dark and a given illumination for the single-crystal linear-chain polyfluorinated dibromo-platinum(II) diimine complex.

FIG. 12 shows the transient photocurrent of the device 400 as a function of time as the illumination source for the device was switched between the ON and OFF states. At a constant V$_{DS}$ (5 V), the current goes up to a high value 1200 (ON state) under 532 nm laser illumination and rapidly goes down to its original value 1202 (OFF state) in the dark state. At zero gate bias, the current between the two states yields an ON/OFF switching ratio of at least 16, which is very fast, repeatable, and reversible. Note that both the photo- and dark current are not limited by persistent current effects, and the noise level in the ON and OFF states is low and negligible, demonstrating the device's excellent photo-switching and stability.

Figure 13A:
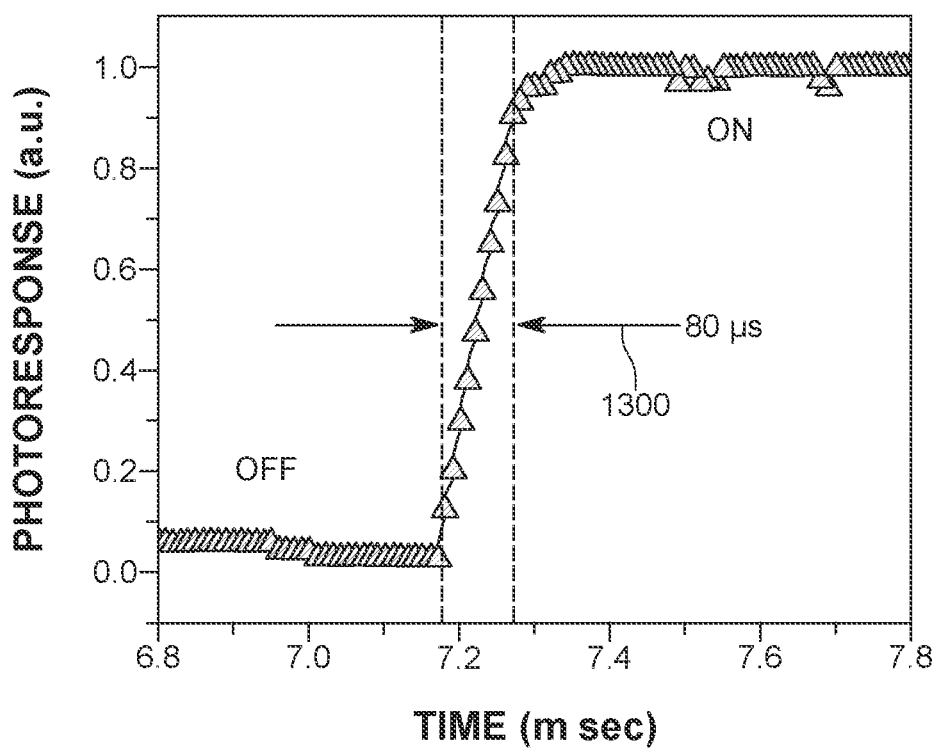
FIG. 13A illustrates the high-resolution response of the single-crystal linear-chain polyfluorinated dibromo-platinum(II) diimine complex and FIG. 13B illustrates the recovery time of the same material, under a given illumination and a bias voltage.
Figure 13B:
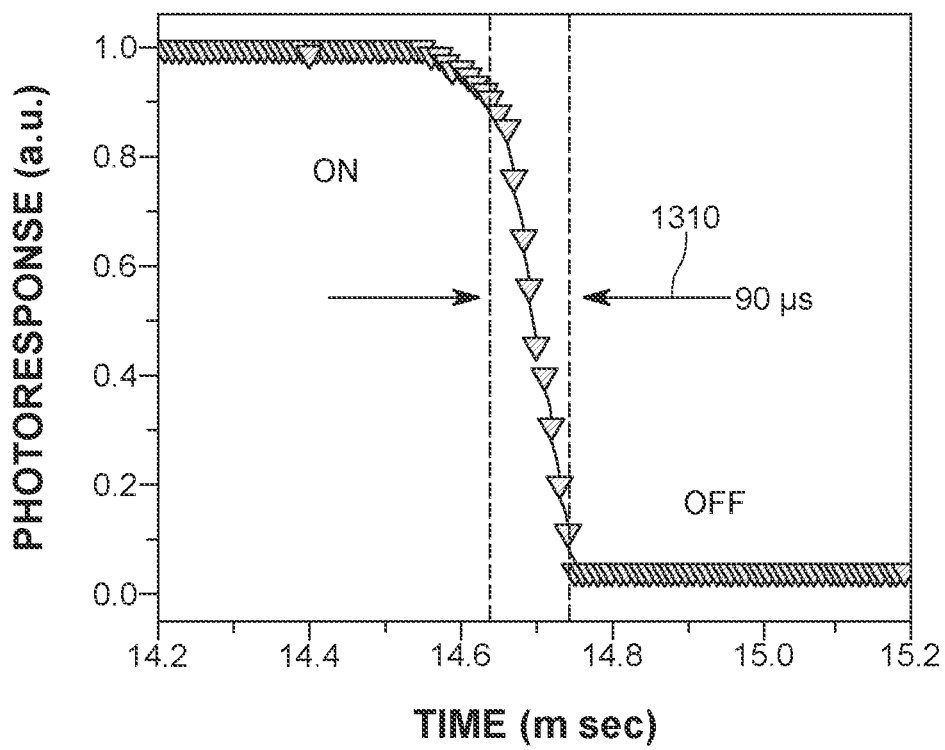

The response and recovery times of the Pt complex (1o) PD device 400 were also measured, which are important figures of merit that describe how fast it responds to external illumination. To determine these values, transient photo-switchings of the device 400 were performed using an optical chopper to modulate the 532 nm laser. It is apparent that the PD device 400 can be reversibly switched between high and low currents as the illumination is chopped at an interval of a few tens of microseconds. As shown in FIGS. 13A and 13B, it was found that the response time 1300 (the time difference between 10% and 90% of the steady-state maximum photocurrent as the light is switched from OFF to ON) and the recovery time 1310 (the time difference between 90% and 10% of the maximum photocurrent as the light is switched from ON to OFF) of the Pt complex (1o) PD device 400 were 80 and 90 µs, respectively. These values are several orders of magnitude faster compared to the response times of other linear-chain-like organic semiconductor devices, such as those based on F$_{16}$CuPc (about 10 ms), crystalline microplates of 2-ethynyl-5-hexyldithieno[3,2-b:2',3'd] thiophene (DTT), and other organic semiconductors that feature a very high photo-response. Furthermore, the photo-response of the device 400 remains identical over numerous cycles as a result of no obvious charge transfer process that would stimulate carrier recombination. The fast switching speed of the Pt complex (1o) PD device 400 is due to the well-proportioned inter-laced packing of the molecular structure and the reduction of carrier-trapping sites, which render the material an efficient photosensitive switch.

In general, compared with the response time, the recovery time is usually a slow process due to the poor recombination cross-section of trapped carriers. However, the recovery time for the PD device 400 is nearly identical to the response time, which can be ascribed to the fast recombination cross-section of the photogenerated carriers in the presence of the electric field without any charge transfer effect, resulting in the very fast switching capability of the device.

Figure 14A:
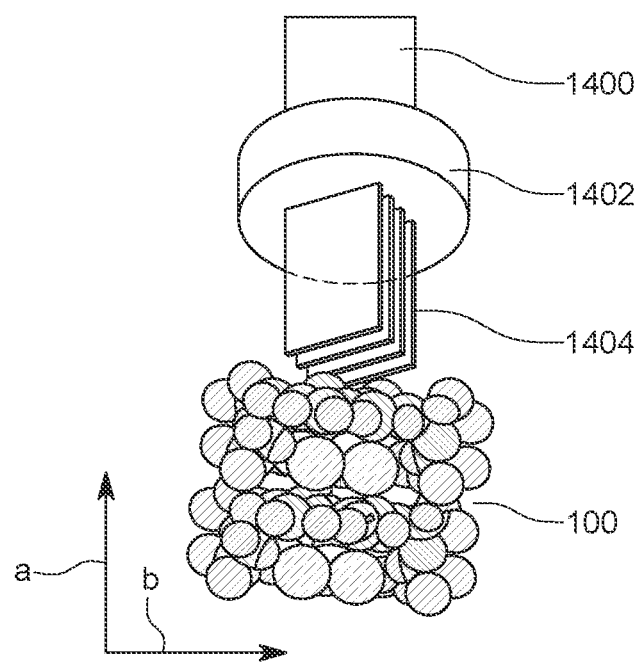
FIG. 14A illustrates polarized light impinging on the single-crystal linear-chain polyfluorinated dibromo-platinum(II) diimine complex and FIG. 14B illustrates the polarization-dependent photo-response of the complex.
Figure 14B:
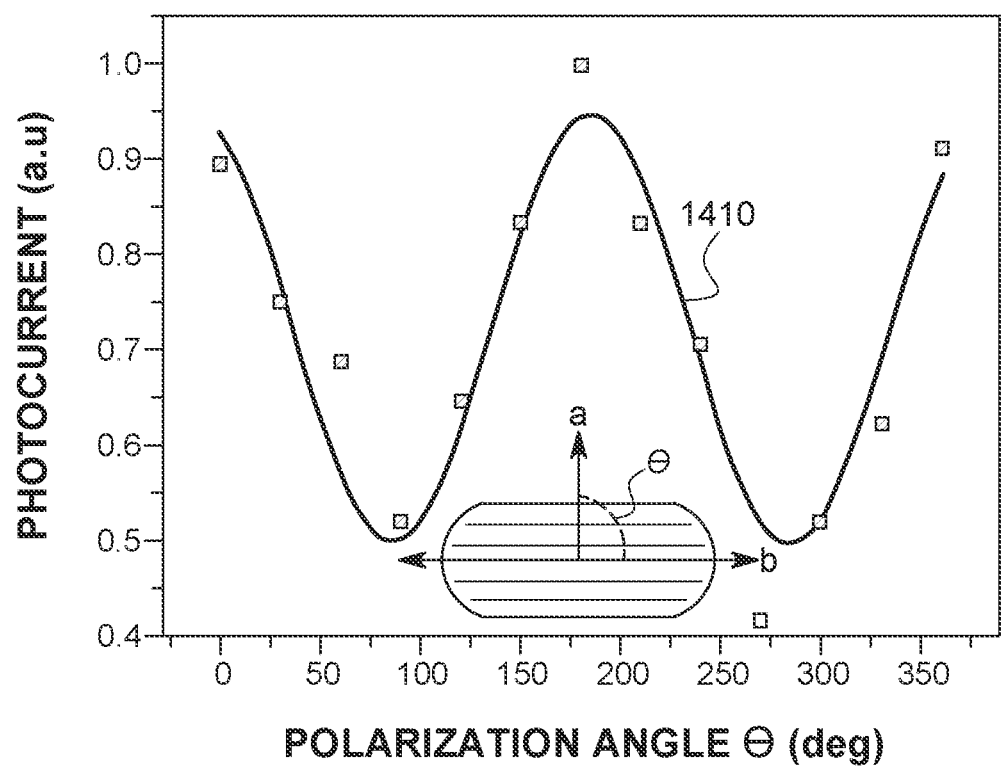

The polarization sensitivity of the device 400 was also investigated, as the polarization sensitivity is an important figure of merit for PDs. This investigation has been performed by varying the polarization of the incident light, as schematically shown in FIG. 14A. More specifically, unpolarized light (or natural light) 1400 is sent through a polarizer 1402 for generating polarized light 1404. The polarizer 1402 can be rotated with any desired angle. FIG. 14B shows the relationship between the PD 400 responsivity (on the Y axis) and the relative angle between the incident polarized light 1404 along the b-axis of the crystal, which is aligned at 0° to the polarizer 1402. The measured photo-response 1410 in FIG. 14B exhibits a cosine dependence with the angle of the polarization of the incident light, with a maximum-to-minimum photocurrent ratio of 2, indicating that the PD device 400 features a strong polarization sensitivity. In other words, the maximum and minimum photo-responses are attained when the incident light is polarized along the b-axis and a-axis, respectively, demonstrating the strong anisotropic properties of the single-crystal Pt complex (1o) 100. This indicates that more photons are absorbed when they are polarized along the b-axis compared to those polarized along the a-axis. These findings suggest that the Pt complex (1o) crystal 100 can be used for multi-photodetector applications, in which the material can not only sense photons, but also can measure the polarized state of the incident photons.

Due to the unique properties of the Pt complex (1o) crystal, which are made possible by its lamellar molecular structure and fluorine incorporation, the above discussed PD device 400 has achieved a breakthrough in organic-material-based PDs in terms of high mobility, photosensitivity, fast response and recovery speeds, long-term stability, polarization sensitivity, and water resistance.

It is noted that the quasilinear Pt . . . Pt . . . Pt interaction promotes a high hole of the transfer integral along the π-π stacking direction, as revealed by theoretical calculations. The change in the transfer integral along different axes suggests that the single-crystal Pt complex 100 behaves as an ambipolar semiconductor.

The embodiments discussed above demonstrate a highly efficient PD device 400 based on a single-crystal, linear-chain, polyfluorinated dibromo-platinum(II) diimine complex 100. The polyfluorinated Pt complex (1o) 100 features the combined benefits of a lamellar molecular structure and the incorporation of fluorine-containing groups on the side chains, resulting in very high mobility and stability. The polyfluorinated Pt-complex (1o) device 400 discussed herein shows a stable mobility (up to 0.45 cm$^2$ V$^{-1}$ s$^{-1}$ at a threshold voltage of 1.12 V) and water-repellant properties (a 22% and 5.7% mobility degradation after 90 days without encapsulation in air and immersion in distilled water for 24 h, respectively). Furthermore, the device 400 features a high photoresponsivity of 1000 A W$^{-1}$ at 5 V bias and an ON/OFF switching ratio of 16 at zero gate bias, which it is attributed to the high gain and low noise of the organic PD's molecular structure. The temporal response of the photocurrent reveals record response and recovery times as fast as 80 and 90 μs, respectively. In particular, the performance of the device 400 presented here is remarkable compared to other devices featuring organic-semiconductor-based channels. Therefore, the polyfluorinated Pt complex (1o) 100 can serve as a valuable reference for the development of high detectivity, long-term stability, polarization sensitive, and fast photoresponse PDs, as well as for the advancement of future integrated electronic and optoelectronic devices beyond conventional materials and techniques.

The disclosed embodiments provide a PD device based on a single-crystal, linear-chain, polyfluorinated dibromo-platinum(II) diimine complex. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] A. L. Briseno, S. C. B. Mannsfeld, M. M. Ling, S. Liu, R. J. Tseng, C. Reese, M. E. Roberts, Y. Yang, F. Wudl, Z. Bao, Nature 2006, 444, 913.
[2] V. C. Sundar, J. Zaumseil, V. Podzorov, E. Menard, R. L. Willett, T. Someya, M. E. Gershenson, J. A. Rogers, Science 2004, 303, 1644.
[3] R. Zeis, T. Siegrist, C. Kloc, Appl. Phys. Lett. 2005, 86, 022103.
[4] C. Wang, H. Dong, W. Hu, Y. Liu, D. Zhu, Chem. Rev. 2012, 112, 2208.
[5] R. T. Weitz, K. Amsharov, U. Zschieschang, E. B. Villas, D. K. Goswami, M. Burghard, H. Dosch, M. Jansen, K. Kern, H. Klauk, J. Am. Chem. Soc. 2008, 130, 4637.
[6] M.-M. Ling, Z. Bao, P. Erk, Appl. Phys. Lett. 2006, 89, 163516.
[7] J. C. Biffinger, H. W. Kim, S. G. DiMagno, ChemBioChem 2004, 5, 622.
[8] J. D. Dunitz, R. Taylor, Chem.—Eur. J. 1997, 3, 89.
[9] S. Uttiya, L. Raimondo, M. Campione, L. Miozzo, A. Yassar, M. Moret, E. Fumagalli, A. Borghesi, A. Sassella, Synth. Met. 2012, 161, 2603.
[10] H. Klauk, U. Zschieschang, J. Pflaum, M. Halik, Nature 2007, 445, 745.
[11] Z. Bao, Adv. Mater. 2000, 12, 227.
[12] N. Lu, L. M. Hight, D. R. McMillin, J.-W. Jhuo, W.-C. Chung, K.-Y. Lin, Y.-S. Wen, L.-K. Liu, Dalton Trans. 2014, 43, 2112.
[13] N. Lu, Y.-M. Ou, T.-Y. Feng, W.-J. Cheng, W.-H. Tu, H.-C. Su, X. Wang, L. Liu, M. D. Hennek, T. S. Sayler, J. S. Thrasher, J. Fluorine Chem. 2012, 137, 54.

What is claimed is:

1. A photodetection device configured to detect light, the photodetection device comprising:
    a substrate having a largest surface;
    a dielectric formed over the largest surface of the substrate;
    a first metallic electrode formed on the dielectric;
    a second metallic electrode formed on the dielectric, at a given distance from the first metallic electrode, to form a channel; and
    a single-crystal linear-chain polyfluorinated dibromo-platinum(II) diimine complex located in the channel.

2. The photodetection device of claim 1, wherein the single-crystal linear-chain polyfluorinated dibromo-platinum(II) diimine complex has a lamellar structure, and wherein the single-crystal linear-chain polyfluorinated dibromo-platinum(II) diimine complex is arranged in the channel so that the lamellar structure extends parallel to the largest surface of the substrate.

3. The photodetection device of claim 2, wherein, a charge mobility of 0.45 cm$^2$ V$^{-1}$ s$^{-1}$ is obtained for a threshold voltage of 1.12 V.

4. The photodetection device of claim 2, wherein, a photo-response of 1000 A W$^{-1}$ is obtained for 5 V bias.

5. The photodetection device of claim 2, an ON/OFF switching ratio of 16 is obtained for zero bias.

6. The photodetection device of claim 2, wherein, a temporal response of the photocurrent is 80 µs, and a recovery time is 90 µs.

7. The photodetection device of claim 2, wherein, a photocurrent varies as a sine wave with a polarization angle of an incoming polarized light.

8. The photodetection device of claim 1, wherein platinum atoms in the lamellar structure are arranged to face each other to form a chain.

9. The photodetection device of claim 1, wherein the single-crystal includes two monomers that form a dimer, and the two monomers are identical and each monomer includes two N atoms, one Pt atom, two Br atoms and six F atoms.

10. The photodetection device of claim 9, wherein each monomer of the dimer extends in a corresponding plane, and the corresponding planes are parallel to each other.

11. The photodetection device of claim 1, further comprising:
a gate electrode formed on the substrate, opposite to the first and second metallic electrodes.

12. The photodetection device of claim 1, further comprising:
an encapsulation layer formed over the first and second metallic electrodes and the single-crystal linear-chain polyfluorinated dibromo-platinum(II) diimine complex.

13. The photodetection device of claim 12, further comprising:
a gate electrode formed over the encapsulation layer.

14. A phototransistor comprising:
a substrate having a largest surface;
a dielectric layer formed over the largest surface of the substrate;
a first metallic electrode formed on the dielectric;
a second metallic electrode formed on the dielectric, at a given distance from the first metallic electrode, to form a channel;
a single-crystal linear-chain polyfluorinated dibromo-platinum(II) diimine complex located in the channel; and
a gate electrode formed to face the single-crystal linear-chain polyfluorinated dibromo-platinum(II) diimine complex through a dielectric material.

15. The phototransistor of claim 14, wherein the single-crystal linear-chain polyfluorinated dibromo-platinum(II) diimine complex has a lamellar structure, and wherein the single-crystal linear-chain polyfluorinated dibromo-platinum (II) diimine complex is arranged in the channel so that the lamellar structure extends parallel to the largest surface of the substrate.

16. The phototransistor of claim 15, wherein, a charge mobility of 0.45 cm$^2$ V$^{-1}$ s$^{-1}$ is obtained for a threshold voltage of 1.12 V, a photo-response of 1000 A W$^{-1}$ is obtained for 5 V bias, an ON/OFF switching ratio of 16 is obtained for zero bias, and a temporal response of the photocurrent is 80 µm, and a recovery time is 90 µm.

17. The phototransistor of claim 14, wherein the single-crystal includes two monomers that form a dimer, and the two monomers are identical and each monomer includes two N atoms, one Pt atom, two Br atoms and six F atoms.

18. The phototransistor of claim 14, wherein the gate electrode is formed on the substrate, opposite the dielectric layer.

19. The phototransistor of claim 14, further comprising:
an encapsulation layer formed to cover the first and second metallic electrodes and the single-crystal linear-chain polyfluorinated dibromo-platinum(II) diimine complex.

20. The phototransistor of claim 19, wherein the gate electrode is formed directly on the encapsulation layer.

* * * * *